(12) United States Patent
Theuwissen

(10) Patent No.: US 9,040,894 B2
(45) Date of Patent: May 26, 2015

(54) IMAGER WITH COLUMN READOUT

(71) Applicant: Harvest Imaging bvba, Bree (BE)

(72) Inventor: Albert Theuwissen, Bree (BE)

(73) Assignee: Harvest Imaging bvba (BE)

( * ) Notice: Subject to any disclaimer, the term of this patent is extended or adjusted under 35 U.S.C. 154(b) by 214 days.

(21) Appl. No.: 13/727,681

(22) Filed: Dec. 27, 2012

(65) Prior Publication Data

US 2014/0183332 A1 Jul. 3, 2014

(30) Foreign Application Priority Data

Dec. 27, 2011 (EP) .................................... 11195783

(51) Int. Cl.
*H01L 27/00* (2006.01)
*H01L 27/146* (2006.01)
*H04N 5/3745* (2011.01)
*H04N 5/376* (2011.01)
*H04N 5/345* (2011.01)

(52) U.S. Cl.
CPC ........ *H01L 27/14609* (2013.01); *H04N 5/3745* (2013.01); *H04N 5/376* (2013.01); *H04N 5/345* (2013.01); *H01L 27/14601* (2013.01)

(58) Field of Classification Search
USPC .................. 250/208.1, 214 R; 348/241–311; 257/290–292, 440
See application file for complete search history.

(56) References Cited

U.S. PATENT DOCUMENTS

| 8,817,143 B2* | 8/2014 | Murata et al. ................. 348/294 |
| 2007/0285548 A1 | 12/2007 | Gomi |
| 2008/0218614 A1 | 9/2008 | Joshi |
| 2009/0086084 A1 | 4/2009 | Komaba |

OTHER PUBLICATIONS

Search and Examination Reports in EP 11195783.3, issued May 4, 2012.

* cited by examiner

*Primary Examiner* — Que T Le
(74) *Attorney, Agent, or Firm* — Barnes & Thornburg LLP

(57) ABSTRACT

An array (31) comprising a plurality of pixels (Pi,j) for detecting radiation, the pixels (Pi,j) being arranged in rows and columns is typically arranged for reading out pixel information on a row-by-row basis. According to the present invention, the array (31) is furthermore provided with selectable means for moving pixel information of a first set (35) of pixels of different rows, e.g. of a particular column, of the array, the first set (35) of pixels (Pi,j) comprising a number of pixels (Pi,j) larger than one, into information present on a number of columns of the array equal to the number of pixels (Pi,j) in the first set (35). This way, pixel information on a plurality of pixels of different rows, e.g. of a same column, can be read out simultaneously.

11 Claims, 5 Drawing Sheets

IMAGER WITH COLUMN READOUT

FIELD OF THE INVENTION

The present invention relates to image sensing, such as medical imaging, automotive imaging, machine vision, night vision, digital photography or digital camcorder imaging. The present invention relates to devices and methods for detection of radiation, and more particularly to devices and methods for fast reading out of detected radiation on a column of pixels.

BACKGROUND OF THE INVENTION

One type of image sensor is an active pixel sensor (APS). APS image sensors are typically fabricated using metal oxide semiconductor (MOS) processing technology, in particular for example Complementary Metal Oxide Semiconductor (CMOS) processing technology, and are typically referred to as (C)MOS image sensors. CMOS image sensors sense light by converting incident radiation (photons) into electronic charge (electrons) via the photoelectric effect. CMOS image sensors typically include a photoreceptor (e.g. photodiode) and several CMOS transistors for each pixel.

Existing CMOS image sensors include, but are not limited to, three-transistor (3T) and four-transistor (4T) pixel implementations. Pixel implementations with more than four transistors have also been implemented. The pixel circuits in this type of image sensors typically include a source follower transistor that is used to buffer the photoreceptor voltage onto a column line.

An existing pixel configuration is illustrated in FIG. 1. FIG. 1 illustrates, as an example only, a 4T pixel 10 for a CMOS image sensor. All transistors in the pixel are MOS transistors. The pixel 10 illustrated in FIG. 1 comprises a photoreceptor 11, in the example illustrated a pinned photodiode PPD, for converting impinging radiation into electronic charge. The pixel 10 furthermore includes a sample and hold transistor 12 for transferring charge generated by the photoreceptor 11 towards a sense node 16, a reset transistor 13 for resetting the sense node to a starting value, a source follower transistor 14 for converting the transferred charge into a voltage and a select transistor 15 for actually putting that voltage onto a column line.

A classical configuration of a CMOS image sensor 20 is illustrated in FIG. 2. The image sensor 20 comprises a 2-dimensional array 21 of pixels 10 arranged in n rows and m columns. In the example illustrated in FIG. 2 there are 7 rows and 10 columns. The pixels 10 in the array may be any suitable type of pixels, for examples pixels as illustrated in FIG. 1.

In typical prior art systems, all pixels 10 arranged on a column in the array 21 are connected to a column bus OUT for reading out pixel information generated by and stored in the pixels 10. Pixel information from a CMOS image sensor is typically read out sequentially, row per row. This sequential readout technique is realized by horizontal and vertical scan circuitry. These digital parts are not illustrated in FIG. 2.

The prior art readout process can start at the top, at the bottom of the array, or at any randomly chosen row, but in any case rows are read out one after the other. This means that first the pixel information of pixels on a first row is read out, thereafter pixel information of pixels of a second row, typically adjacent the first row, and so on.

A classical timing that goes together with such a way of reading the sensor may be as follows (based on the pinned photodiode implementation with four transistors in each pixel, as illustrated in FIG. 1):

a) All pixels in a particular row are being reset by means of reset transistor 13;
b) The select transistor 15 is activated, and the source follower 14 is connected to a bias current;
c) The reset level is sampled by the analog circuitry 22 of the columns;
d) The sample and hold transistor 12 is activated and the electrons are transferred from the photoreceptor 11 towards the sense node;
e) The actual video level is sampled by the analog circuitry 22 of the columns;
f) When the two samples (reset level and actual video level) are available, they are subtracted from one another in the analog domain;
g) The analog signal is converted into the digital domain by means of AD converters 23;
h) The digital data is multiplexed and transferred off chip via digital output bus 24.

The complete cycle from a) to h) is required for reading out pixel information from a single line of pixels, and will take up a complete line time. With a simple calculation, taking as an example a sensor with 6000 columns and 4000 rows, 5 frames/s, the total frame time will be 200 ms. The total available line time will be: $1/(4000*5)=0.05$ ms.

In case one is not interested in the complete information from the sensor, but only in the information of one column, still the complete sensor needs to be read out because the readout mechanism is based on a line-by-line system. In the aforementioned case, it will take 200 ms to read out pixel information from a single column of pixels.

SUMMARY OF THE INVENTION

It is an object of embodiments of the present invention to provide methods and systems allowing improved, e.g. faster, readout of data on a column of pixels.

The above objective is accomplished by a method and device according to the present invention.

In a first aspect, the present invention provides an array comprising a plurality of pixels for detecting radiation, the pixels being logically arranged in rows and columns. The array is adapted for reading out pixel values on a row-by-row basis. In accordance with embodiments of the present invention, the array comprises a first set of pixels located on different rows of the array, the first set of pixels comprising a number of pixels larger than one. Each pixel in the first set of pixels comprises a switchable datapath for transferring its pixel information onto a horizontal row bus line. Each pixel in the first set of pixels is furthermore associated with another pixel located on the same row but in a different column, the other pixel being adapted for putting the pixel information present on the horizontal row bus line on a column-line associated with the other pixel. The other pixels for the plurality of pixels of the first set are selected so as to be all arranged on different columns. This allows simultaneous readout of all pixels for which information needs to be moved.

By converting pixel information of pixels present on different rows, for example pixel information of pixels of a column, into information present on a plurality of columns on a single row, readout of one single row may provide the information of the plurality of pixels in the column. This allows faster readout of pixel information of pixels arranged on a column.

In accordance with embodiments of the present invention, the horizontal row bus may be a horizontal reset line. This has the advantage that no supplementary row busses are needed; re-use of existing row busses is possible, provided the horizontal reset lines are correctly pulsed.

Alternatively, the horizontal row bus may be a dedicated horizontal line for transferring data from a column of pixels towards another column.

The other pixels may be provided with a switchable path for connecting between the row bus and the column bus with which the other pixels are associated. Hereto, the switchable path may be provided with a switch.

In an array according to embodiments of the present invention, the first set of pixels may comprise focus pixels.

In a second aspect, the present invention provides an imager comprising an array of pixels according to the first aspect of the present invention.

In a third aspect, the present invention provides a method for transferring pixel information of a first set of pixels arranged on at least two different rows, e.g. on a column, of an array of pixels, the pixel array comprising a plurality of pixels being logically arranged in rows and columns, each pixel in the first set of pixels being associated to a row bus line and to another pixel located on the same row but in a different column. The method comprises transferring the pixel information of each of the pixels of the first set onto a corresponding row bus line, and transferring the pixel information present on the row bus lines to the column lines of the other pixels associated with the pixels of the first set for simultaneous readout.

In a method according to embodiments of the present invention, transferring the pixel information onto a row bus line may comprise transferring the pixel information onto a reset line. Alternatively, transferring the pixel information onto a row bus line may comprise transferring the pixel information onto a row bus line dedicated for conversion of data of a first set of pixels into data of a second set of pixels.

In a method according to embodiments of the present invention, transferring pixel information on the row bus lines onto respective column lines may include closing, i.e. making electrically conductive, a selectable path between the row bus lines and the column lines. Closing the path may include switching ON a transistor.

In embodiments of the present invention, the method may furthermore comprise simultaneously reading out the pixel information of each of the pixels of the first set.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
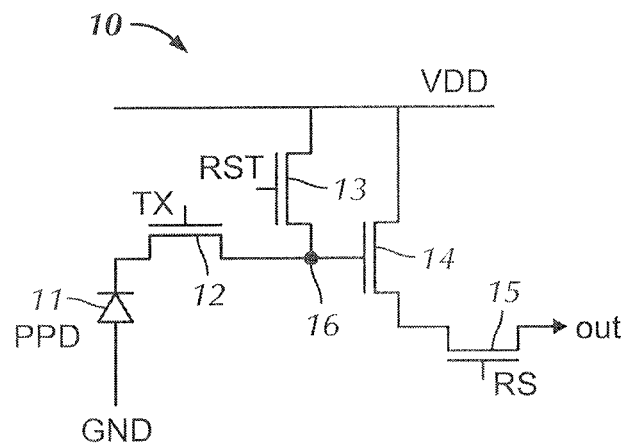
FIG. 1 illustrates a prior art 4T pixel.
Figure 2:
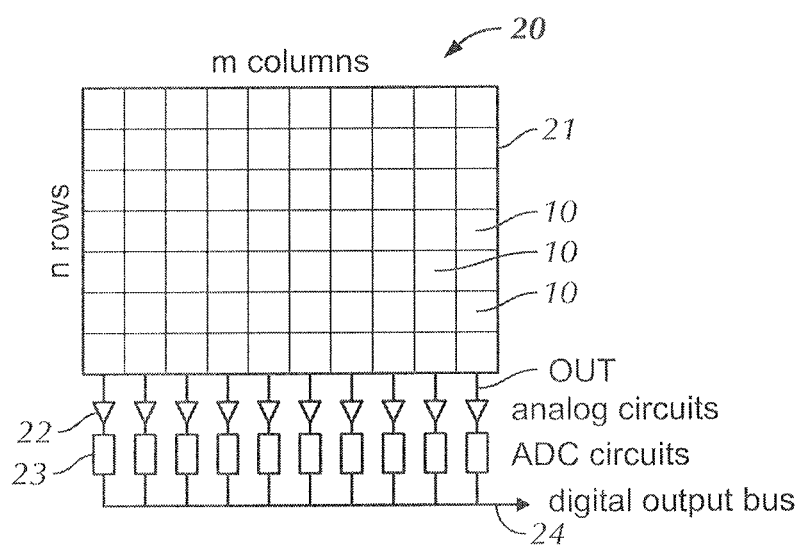
FIG. 2 illustrates a prior art array of pixels with readout circuitry.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the present invention, the impinging and hence detected radiation may be electromagnetic radiation of any type, e.g. visible light, UV light, infra-red light, X-rays, gamma rays. Alternatively, the impinging radiation may be particles, including low or high energy electrons, protons, hadrons or other particles.

Embodiments of the present invention relate to an imager, for example but not limited to a CMOS imager, comprising an array of pixels for detecting radiation. Typically, in such array the pixels are organized in the array in rows and columns. The terms "column" and "row" are used to describe sets of array elements which are linked together. The linking can be in the form of a Cartesian array of rows and columns, however, the present invention is not limited thereto. Also non-Cartesian arrays may be constructed and are included within the scope of the invention. Accordingly the terms "row" and "column" should be interpreted widely. To facilitate in this wide interpretation, there may be referred to "logically organised rows and columns". For example, the rows may be circles and the columns radii of these circles and the circles and radii are described in this invention as "logically organised" rows and columns. By this is meant that sets of pixels are linked together in a topologically linear intersecting manner; however, that the physical or topographical arrangement need not be so. Throughout this description, the terms "horizontal" and "vertical" (related to the terms "row" and "column" respectively) are used to provide a co-ordinate system and for ease of explanation only. They do not need to, but may, refer to an actual physical direction of the device.

As will be understood by those skilled in the art, columns and rows can be easily interchanged and it is intended in this disclosure that these terms be interchangeable. Irrespective of its physical direction, a "column" is meant to indicate a first direction in an array of pixels, along which neighboring pixels are arranged which are typically read out in subsequent scan operations. A "row" indicates a second direction along which neighboring pixels are arranged which are typically read out simultaneously. Row direction and column direction are different directions, for example orthogonal directions.

Also, specific names of the various lines in an array of pixels, e.g. reset line or select line, are intended to be generic names used to facilitate the explanation and to refer to a particular function. It should be understood that all these terms are used only to facilitate a better understanding of the specific structure being described, and that the specific choice of words is not intended to in any way limit the invention.

Figure 3:
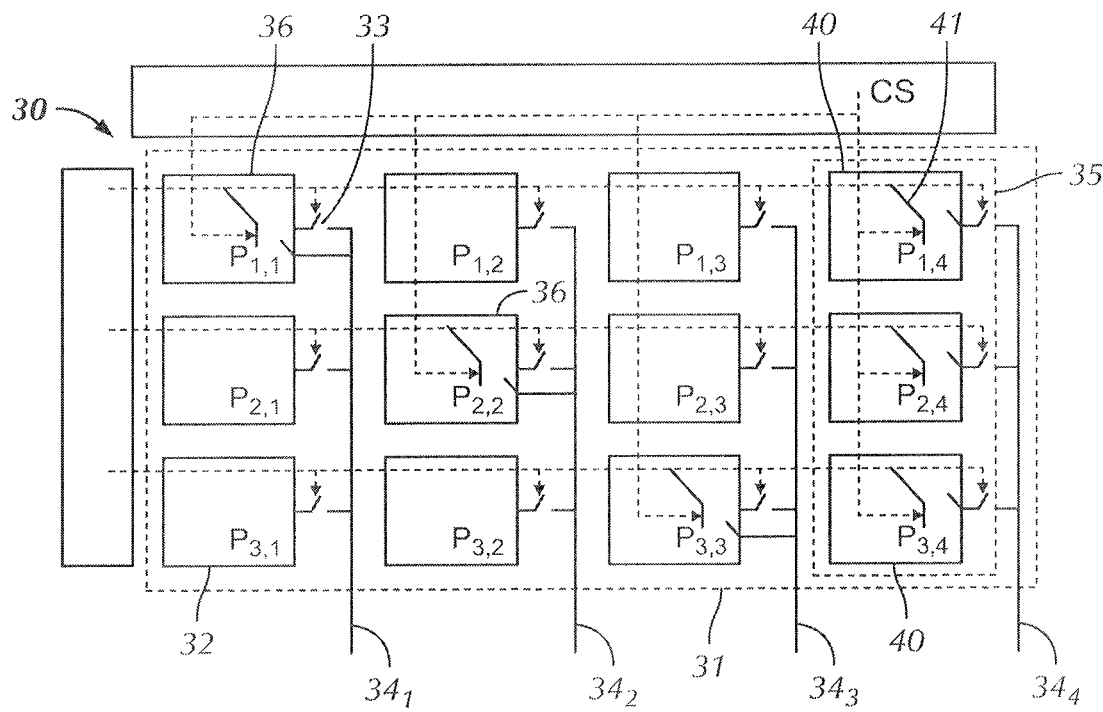
FIG. 3 illustrates an array of pixels according to embodiments of the present invention.

An imager 30 according to embodiments of the present invention is illustrated in FIG. 3. The imager 30 is adapted for, in a first mode of operation, reading row-by-row image date captured by the pixels of the images, and in a second mode of operation, simultaneously reading data captured by a plurality of pixels on different rows, by a re-mapping process.

Hereto, the imager 30 according to embodiments of the present invention comprises an array 31 of pixels 32, 40 for detecting radiation. In the embodiment illustrated in FIG. 3, an n×m imager of dimensions 3×4 is illustrated, i.e. an array of 3 rows in horizontal direction and 4 columns in vertical direction. Each row comprises a number of pixels 32, 40 not more than, e.g. equal to, the number of columns, in the example illustrated four pixels, and each column comprises a number of pixels 32, 40 not more than, e.g. equal to, the number of rows, in the example illustrated three pixels. The numbers given in the example of FIG. 3, however, are for ease of illustration only. In actual implementations of imagers there will most often be many more rows and columns in the array 31, such as for example 800 rows by 600 columns, or 1600 rows by 900 columns, or 4000 rows by 6000 columns, but also other row/column relationships are possible. This leads to imagers typically comprising about 500.000 pixels 32 or (many) more. 6M to 20M pixel imagers are not uncommon.

Each pixel 32, 40 in the array 31 of pixels is associated with a row i and a column j. With "associated with a row i and a column j" is meant that the pixel forms part of row i and column j, or thus that the pixel associated with row i and column j is located at position i,j in the array 31. A pixel at position i,j in the array 31 may be indicated by $P_{i,j}$. Not only pixels $P_{i,j}$ are associated with a row and a column, also column lines are associated with columns and row lines are associated with rows.

For traditional readout, a pixel $P_{i,j}$ is connectable by means of a switch 33, for example implemented as a transistor, to a column line $34_j$ of the column j it is associated with, for outputting pixel information. The pixels $P_{i,j}$ (i=1 . . . n) of a single column j are connectable by means of their switch 33 to the column line $34_j$. During operation, one pixel $P_{i,j}$ of a column j is selected at a time for readout (the one on the row i that will be read out), and this simultaneously for a plurality of pixels on the row i; the pixel information of these pixels $P_{i,l}$, . . . $P_{i,m}$ (for an array with m columns) is put on the associated column lines $34_1$ . . . $34_m$, and the column lines $34_1$ . . . $34_m$ are read out. The processing of the information can be done in the analog domain, in the digital domain or a combination of both.

In normal sensor operation (e.g. for still picture applications or video applications), the imager 30 is sequentially read out, row by row. This means that all pixels $P_{i,j}$ of a row i put their pixel information on their associated column line $34_j$. These column lines may be read out in parallel. Thereafter, all pixels of another row i+1 put their data on their associated column line $34_j$ for being read out, etc.

In accordance with embodiments of the present invention, an array 31 may be adapted for allowing simultaneous readout of a first set 35 of at least two pixels, e.g. at least three pixels, such as at least four pixels, at least ten pixels, at least twenty pixels, of a particular column j of the array 31. In the embodiment illustrated in FIG. 3, the first set 35 is formed by the right hand column of pixels of the array 31; the invention, however, not being limited thereto. The first set 35 of pixels in a column to be read out simultaneously could be provided in another column than the right hand one, and/or the first set 35 of pixels could be limited to less than all the pixels $P_{i,j}$ in the column.

An adapted pixel 40 according to embodiments of the present invention, which is a pixel of the first set 35 of at least two pixels, e.g. at least three pixels, such as at least four pixels, at least ten pixels, at least twenty pixels, is provided with a datapath 41, for example a switchable datapath, intended for transferring pixel information onto a horizontal row bus associated with the row the pixel 40 is associated with, rather than onto a vertical column line which is the usual line for reading out the pixel information. Ultimately the vertical column lines $34_1$ . . . $34_3$ will still be used for simultaneously reading out the pixel information of the pixels of the first set 35 of pixels, but this pixel information for the different pixels of the first set 35 will be transferred via the horizontal row busses to the plurality of vertical column lines $34_1$ . . . $34_3$. The datapath 41 may be a switchable data path, which may comprise or consist of a column select switch.

Figure 4:
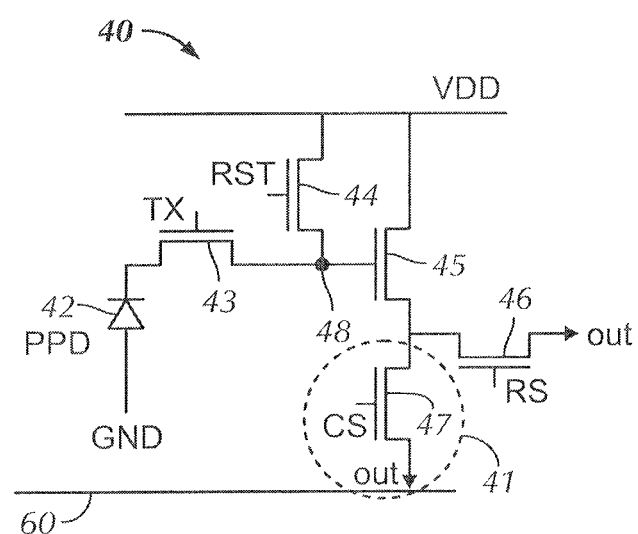
FIG. 4 illustrates a 4T pixel according to embodiments of the present invention, arranged for transferring charge towards a row bus line.

An example of a 4T pixel 40 according to embodiments of the present invention, provided with a switchable data path, is illustrated in FIG. 4. The pixel 40 comprises a photoreceptor 42, in the example illustrated a pinned photodiode PPD, for converting impinging radiation into electronic charge. The pixel 40 furthermore includes a sample and hold transistor 43 for transferring charge generated by the photoreceptor 42 towards a sense node 48, a reset transistor 44 for resetting the sense node to a starting value, a source follower transistor 45 for buffering the voltage on the sense node 48, a select transistor 46 for putting the source follower's output voltage onto a column line 34, and a datapath 41 comprising a further select transistor 47 for putting the source follower's output voltage onto a row bus line 60.

The photoreceptor 42 is connected between ground and the source of the sample and hold transistor 43. The gate of the sample and hold transistor 43 is connected to a transfer line TX, and the drain of the sample and hold transistor 43 is connected to the source of the reset transistor 44 and to the gate of the source follower transistor 45. The drain of the reset transistor 44 is connected to a voltage supply line VDD. The gate of the reset transistor 44 is connected to a reset line RST. The drain of the source follower transistor 45 is also connected to voltage supply line VDD. The source of the source follower transistor 45 is connected to the drain of the select transistor 46. The gate of the select transistor 46 is connected to a row select line RS. The source of the select transistor 46 is connected to a column line OUT.

Reset transistor 44 is used to reset the voltage on the sense node 48. Sample and hold transistor 43 is used for transferring the photoreceptor charge. Source follower transistor 45 receives and amplifies the signal from sense node 48. Select transistor 46 is used to select pixel 40 for readout.

In accordance with embodiments of the present invention, pixel 40 is provided with a supplementary datapath 41 which is also connected to the source of the source follower transistor 45. This supplementary datapath 41 is adapted for being connected to a horizontal row bus line 60, such that upon appropriate actuation of the pixel 40, pixel information may be transferred to the horizontal row bus line 60. In particular embodiments of the present invention, the supplementary datapath 41 is provided with a column select switch 47. When switching the column select switch 47 ON, pixel information present on the gate capacitance of the source follower transistor 45 is transferred to the row bus line 60 to which the supplementary datapath 41 of the pixel 40 is connected.

Although the above example is illustrated as a particular type of 4T pixel, the present invention is not limited thereto. Embodiments of the present invention also include other types of pixels, such as 3T pixels, 5T pixels or other pixels, provided they are adapted for being connected to a horizontal bus line, such that pixel information may be transferred to the horizontal bus line.

Figure 5:
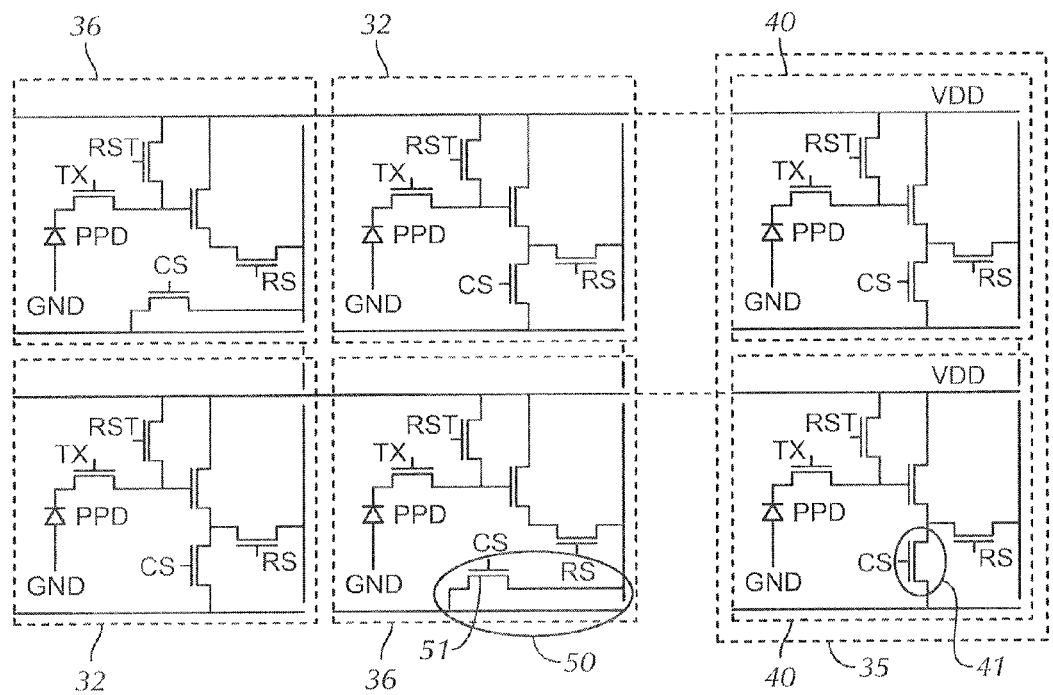
FIG. 5 shows an overview of part of a pixel architecture in accordance with embodiments of the present invention in a two-dimensional imaging array, whereby the right most column will transfer its information onto horizontal row busses from where it will be presented on the vertical column lines of neighboring pixels.

FIG. 5 illustrates part of an array 31 according to embodiments of the present invention. Illustrated are two rows and three columns of a larger array. It can be seen from FIG. 5 that the pixels associated with the right hand column are pixels 40 in accordance with embodiments of the present invention, provided with the supplementary data path 41 for providing pixel information to a row bus line. The present invention, however, is not limited to a first set of pixels in the right hand column being adapted for being read out simultaneously; a first set of pixels with supplementary datapath 41 as in accordance with embodiments of the present invention can be present in any column, even distributed over a plurality of columns.

Figure 6:
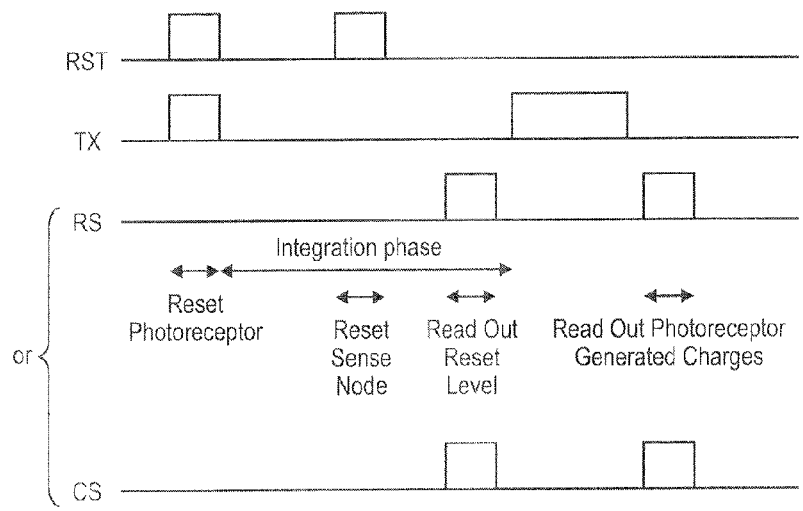
FIG. 6 diagrammatically illustrates a timing chart of different switches in typical operation in a pixel in accordance with embodiments of the present invention.

In operation, as diagrammatically illustrated in the example of FIG. 6, first all pixels in a particular row are being reset. This may be done by setting the reset line RST and the transfer line TX associated with that particular row high, e.g. equal to or above VDD. Setting the reset line RST high turns on reset transistor 44, and setting the transfer line TX high turns on sample and hold transistor 43, and this sets the voltage across the photoreceptor 42 to a fixed starting value.

The reset line RST and the TX signal are then set to low (e.g. ground), thereby turning off reset transistor 44 and turning off sample and hold transistor 43 and beginning an integration phase. While the reset line RST and the transfer line TX are low, pixel 40 integrates the amount of radiation focused onto photoreceptor 42, and photoreceptor 42 discharges from the reset level downward. At the end of the integration phase, the reset line RST is activated again to reset the sense node by means of the reset transistor 44. After closing the reset transistor 44, the voltage present at the sense node is sampled and stored in the analog domain. Next the transfer line TX is set to high to start the readout phase of the radiation-generated information. Setting the transfer line TX to high turns on sample and hold transistor 43, and causes the charge on the photoreceptor 42 to be transferred to a parasitic capacitance at the node connected to the gate of the source follower transistor 45. The transfer line TX is then set to low, thereby turning off sample and hold transistor 43. The voltage delivered by the source follower is sampled again and stored again in the analog domain.

It will be clear for a person skilled in the art that the operational mode as illustrated with respect to FIG. 6 is an example only, and is not intended to be limiting for the present invention. Different pixels may have different operational principles, but even particular pixels may have different operational modes.

For typical readout of pixel information of pixels on a row of the array, the row select line RS would be set to high (e.g. VDD), thus connecting each source follower transistor 45 of the row to its associated column line for reading out the pixel information of that line.

In accordance with embodiments of the present invention, however, it is desired to read out as fast as possible the pixel information of at least two pixels, e.g. at least three pixels, such as at least four pixels, at least ten pixels, at least twenty pixels, in a first set of pixels on a column. These pixels may for example be so-called focus pixels, which aid in determining whether an imaging device such as a digital camera is in focus.

Hereto, considering the example of FIG. 5, where the right hand column comprises the first set 35 of pixels to be read out simultaneously, a column select line CS selecting this right hand column, or in general the column of which pixel information of a first set 35 of pixels is to be read out simultaneously in accordance with embodiments of the present invention, is set to high (e.g. VDD). By doing this, pixel information of the pixels of the first set is put to associated row bus lines, meaning that pixel information of the plurality of pixels of the first set 35 is each put on a separate row bus line. Pixel information of a first pixel of the first set 35 is put on a first row bus line associated with a first row the first pixel is associated with, pixel information of a second pixel of the first set 35 is put on a second row bus line associated with a second row the second pixel is associated with, and so on, whereby the first row bus line and the second row bus line are physically different row bus lines.

Each pixel $P_{i,x}$ of the first set 35 (x being the column of the first set 35) is associated with a particular row i. For each pixel $P_{i,x}$ of the first set 35, on this associated particular row i a transfer pixel 36 is provided, associated with a particular column j≠x, and adapted for transferring the pixel information on the $i^{th}$ row bus line to the particular column j. Transfer pixels 36 associated with different row bus lines are also associated with different column lines. This means that a transfer pixel 36 associated with the first row and a first column is adapted for transferring the pixel information on the first row bus line to a column line associated with the first column. A transfer pixel associated with the second row and a second column different from the first column is adapted for transferring the pixel information on the second row bus line to a column line associated with the second column. And so on.

The transfer pixels 36, indicated $P_{k,l}$, are specifically adapted with a datapath 50 for connecting between the associated $k^{th}$ row bus line and the associated $l^{th}$ column line. This datapath 50 may be a switchable datapath, for example a datapath provided with a column select transistor 51. Such column select transistor 51 may be driven by a column select line CS which is put to high (e.g. VDD) for making the datapath conductive for allowing pixel information to be passed onto the associated column line. The column select line may be the same as the column select line switching on the supplementary datapath 41 in the pixels 40 of the first set 35. This has the advantage that when pixel information of the pixels of the first set 35 is transferred to the associated row bus line, the corresponding transfer pixel 36 is automatically switched on for transferring the pixel information from the row bus line onto the associated column line.

In the embodiment illustrated in FIG. 5, the pixels 40 of the first set 35 of pixels are provided both with a select transistor 46 and with a further select transistor 47. The further select transistor 47 allows for transferring pixel information of pixels of the first set 35 of pixels 40 to column lines associated with other columns than the one the pixels 40 of the first set 35 of pixels is associated with, while the select transistor 46 allows for regular readout of the pixel 40 via its associated column line. In particular embodiments, for example when the first set 35 of pixels are focus pixels, it is only desired to obtain this focus information as quickly as possible. Hence a simultaneous readout of these pixels is always desired, and a subsequent readout of these pixels is not necessary. In such cases, the select transistor 46 could be left out, and only the datapath 41 for simultaneous readout in accordance with embodiments of the present invention needs to be provided.

Figure 7:
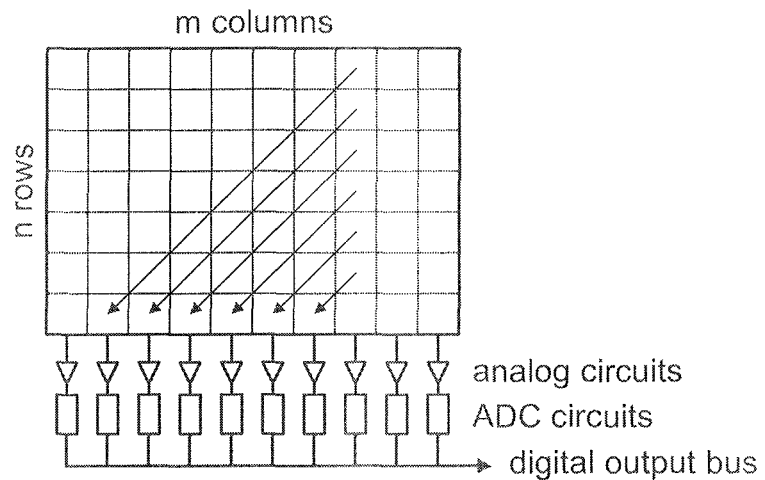
FIG. 7 is a schematic illustration of how to move column information into row information in accordance with embodiments of the present invention.

FIG. 7 illustrates schematically what happens to the pixel information of the first set 35 of pixels arranged on a column and to be read out simultaneously: it is transferred to column lines associated with a second set of pixels arranged on a row, from where it can be read out in a single readout operation of a single line. The arrows indicate how the information of one particular column is transferred into row information.

For the case of the example given earlier, of an imager with 4000 rows and 6000 columns, the readout time of the plurality of pixels of the first set would equal 0.05 ms instead of 200 ms.

Embodiments of the present invention can be applied to the readout of a complete column in one line time, part(s) of a column in one line time, and multiple parts of multiple columns in one line time. Optionally, also a plurality of parts of multiple columns can be read in more than one line time, but in accordance with embodiments of the present invention in less time than the time which would typically be required for reading out the number of lines involved in the plurality of parts of the multiple columns.

In principle all pixels of one row are available for transferring column information. A limitation of the idea of embodiments of the present invention lies in the availability of pixels in one row: at least a same number of pixels need to be available for data transfer in a row as the number of pixels which are arranged in a column and need to be read out simultaneously.

The solution of embodiments of the present invention is hardwired. It does not allow to change/choose the location of the columns that need to be read out.

Figure 8:
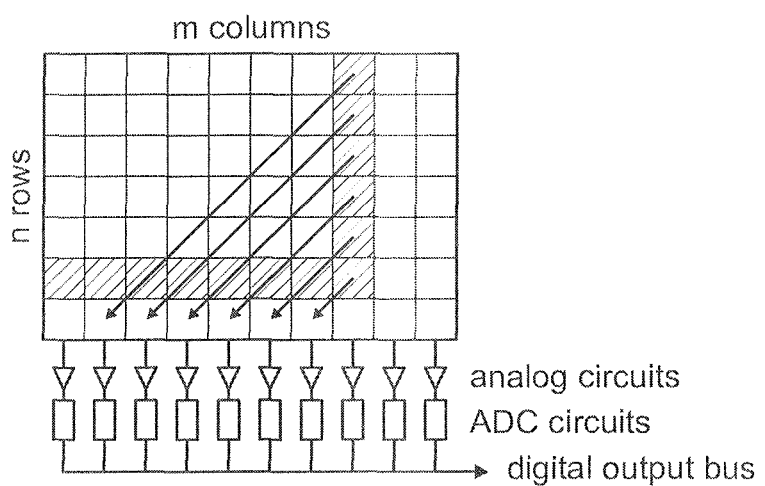
FIG. 8 shows an overview of part of a pixel architecture in accordance with embodiments of the present invention in a two-dimensional imaging array, whereby a row of focus pixels and a column of focus pixels are provided, the column of focus pixels transferring its information onto horizontal row busses from where it will be presented on the vertical column lines of neighboring pixels in a row readout operation, the row of focus pixels also being read out in a row readout operation; the readout of the focus pixels in accordance with embodiments of the present invention hence only requiring a few line readouts.

An application of pixels, arrays and methods according to embodiments of the present invention can for example be found with image sensors that do have focus-pixels distributed across the active area of the image sensor. Instead of reading a complete image to get the focus information, the time to get the information will be reduced to one or at most a few line times. As an example, focus pixels can be in columns and in rows. One such example is illustrated in FIG. 8, where focus pixels are laid out over the image in (part of) a column—indicated by shaded pixels—and (part of) a row—also indicated by shaded pixels. The column(s) can be converted into readout of one or more rows in accordance with embodiments of the present invention. In the example illustrated, readout of the focus pixels in the column can be converted into readout of one row. Readout of the focus pixels in the row may be performed by readout of one row as well. Hence in the embodiment illustrated, the present invention not being limited thereto, it may for example be required to readout two lines; more in general a readout of a few lines, such as for example ten lines, may be required.

Figure 9:
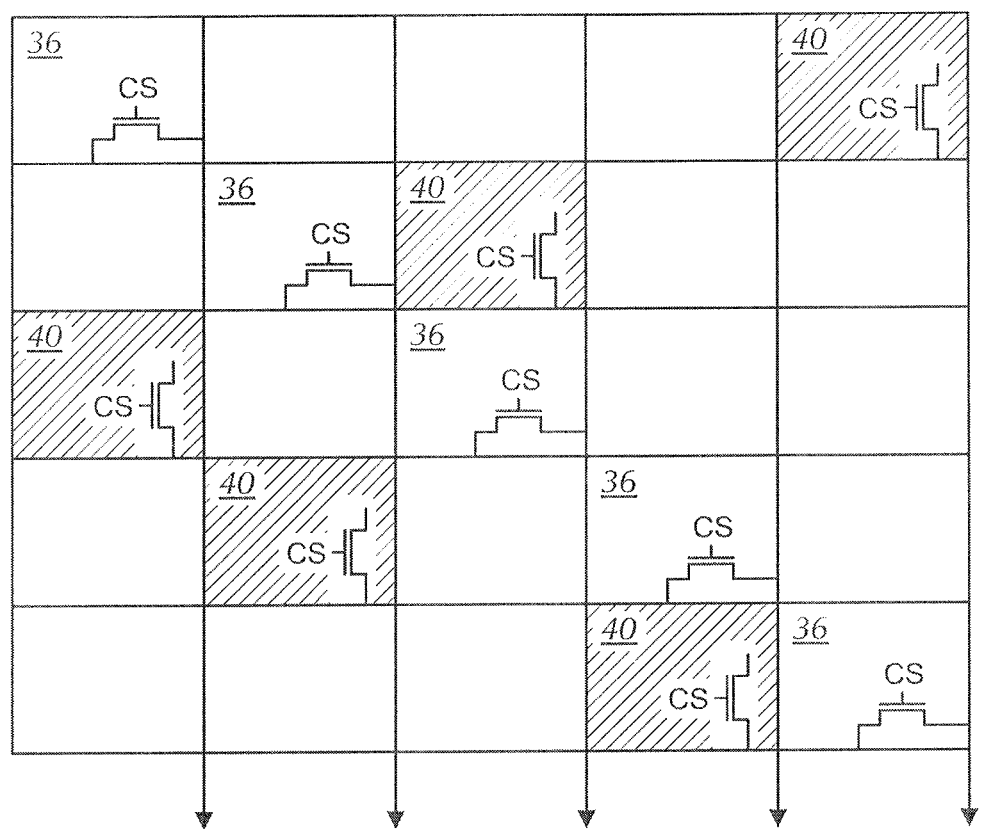
FIG. 9 illustrates part of a pixel architecture in a two-dimensional imaging array in accordance with embodiments of the present invention, where pixels to be read out simultaneously are distributed over a plurality of rows and columns.

Another example is illustrated in FIG. 9, where pixels 40 to be read out simultaneously are distributed over a plurality of rows and columns. The pixels 40 to be read out simultaneously are shaded in FIG. 9. For every pixel 40, specifically adapted for transferring its pixel information onto a row bus line, a corresponding pixel 36 is provided on the same row, adapted for taking over the information from the row bus line and putting it on a column line for readout. This way, depending on the layout of the pixels 40 over the array, these pixels can be read out in accordance with embodiments of the present invention in a single or at most a few line readout operations.

It is advantageous that in embodiments of the present invention there is no need for an extra, new horizontal bus (so-called row bus). The already available reset line can be used for this purpose. However, in alternative embodiments, a dedicated row bus could be provided.

In case extra horizontal lines are added as row bus, the row-column switches can be replaced by a short circuit. A drawback of that solution, however, is the increase in bus capacitance for the regular pixels. Another limitation is that in this case the existing reset lines cannot be used to replace the row busses.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. An array comprising a plurality of pixels for detecting radiation, the pixels being logically arranged in rows and columns, the array being adapted for reading out pixel values on a row-by-row basis,
   characterized in that:
   the array comprises a first set of pixels located on different rows of the array, the first set of pixels comprising a number of pixels larger than one;
   each pixel in the first set of pixels comprising a switchable datapath for transferring its pixel information onto a horizontal row bus line;
   each pixel in the first set of pixels being associated with another pixel located on the same row but in a different column, the another pixel being adapted for putting the pixel information present on the horizontal row bus line on a column-line associated with the another pixel;
   wherein the another pixels for the plurality of pixels of the first set are selected so as to be all arranged on different columns.

2. An array according to claim 1, wherein the first set of pixels comprises a plurality of pixels of one column of the array.

3. An array according to claim 1, wherein the horizontal row bus is a horizontal reset line.

4. An array according to claim 1, wherein the other pixel is provided with a switchable path for connecting between the row bus and the column bus with which the other pixel is associated.

5. An array according to claim 4, wherein the switchable path is provided with a switch.

6. An array according to claim 1, wherein the first set of pixels comprises focus pixels.

7. An imager comprising an array of pixels according to claim 1.

8. A method for transferring pixel information of a first set of pixels arranged on at least two different rows of an array of pixels, the pixel array comprising a plurality of pixels being logically arranged in rows and columns, each pixel in the first set of pixels being associated to a row bus line and to another pixel located on the same row but in a different column;
   the method comprising the steps of:
   transferring the pixel information of each of the pixels of the first set onto a corresponding row bus line, and
   transferring the pixel information present on the row bus lines to the column lines of the another pixels associated with the pixels of the first set for simultaneous readout.

9. A method according to claim 8, wherein transferring the pixel information onto a row bus line comprises transferring the pixel information onto a reset line.

10. A method according to claim 8, wherein transferring pixel information on the row bus lines onto respective column lines includes closing a selectable path between the row bus lines and the column lines.

11. A method according to claim 8, furthermore comprising simultaneously reading out the pixel information of each of the pixels of the first set.

* * * * *